United States Patent [19]

Inoue

[11] Patent Number: 4,685,033
[45] Date of Patent: Aug. 4, 1987

[54] MULTILAYER WIRING SUBSTRATE

[75] Inventor: Tatsuo Inoue, Tokyo, Japan

[73] Assignee: NEC Corporation, Tokyo, Japan

[21] Appl. No.: 768,755

[22] Filed: Aug. 23, 1985

[30] Foreign Application Priority Data

Aug. 28, 1984 [JP] Japan .................................. 59-177534

[51] Int. Cl.⁴ .............................................. H05K 1/14
[52] U.S. Cl. ...................................... 361/414; 29/829;
29/831; 174/68.5; 361/397; 361/412
[58] Field of Search ................................ 361/397–398,
361/402, 411–412, 414; 174/68.5; 29/829,
830–831; 333/1

[56] References Cited

U.S. PATENT DOCUMENTS

| | | | |
|---|---|---|---|
| 3,568,000 | 3/1971 | D'Aboville | 361/414 |
| 4,237,522 | 12/1980 | Thompson | 361/395 X |
| 4,245,273 | 1/1981 | Feinberg et al. | 361/385 X |
| 4,302,625 | 11/1981 | Hetherington et al. | 361/411 X |
| 4,328,531 | 4/1982 | Nagashima et al. | 174/68.5 X |
| 4,353,040 | 10/1982 | Krumm et al. | 331/1 |
| 4,450,029 | 4/1984 | Holbert et al. | 174/68.5 X |
| 4,498,122 | 2/1985 | Rainal | 361/414 |

Primary Examiner—Arthur T. Grimley
Assistant Examiner—Jane K. Lau
Attorney, Agent, or Firm—Burns, Doane, Swecker & Mathis

[57] ABSTRACT

A multilayer wiring substrate is described wherein a plurality of power supply wiring layers for supplying different voltages is arranged in a first group and interlayered with insulation layers and an additional plurality of power supply wiring layers arranged in a second group, each for providing the same voltage as a layer in the first group, is disposed within the same substrate and interlayered with insulation layers. Corresponding wiring layers of the first and second group are interconnected with via-hole wirings. A signal wiring section is disposed on the power supply wiring section. Polyimide layers of insulation separate the wiring layers of the signal wiring section and via-hole wirings include a mixture of gold and polyimide.

9 Claims, 2 Drawing Figures

MULTILAYER WIRING SUBSTRATE

BACKGROUND OF THE INVENTION

The present invention relates to a multilayer wiring substrate and, more particularly, to a multilayer wiring substrate having a plurality of power supply wiring layers.

An example of conventional ceramic multilayer wiring substrates is disclosed in U.S. Pat. No. 4,245,273. The prior art substrate of that patent has a plurality of integrated circuit (IC) chips on the top surface thereof, a plurality of input/output (I/O) pins used as I/O terminals, a plurality of power pins used as power supply terminals on the bottom surface of said substrate, and a plurality of power supply wiring layers provided therein to supply predetermined different voltages to the IC chips and other electrical components provided on the substrate. However, as described later in detail by referring to the drawings, the laminated structure of the power supply wiring layers in the prior art substrate has a disadvantage in that it is not easy to obtain a predetermined voltage from a desired power supply wiring layer at a desired location on the substrate. Another disadvantage of the prior art substrate is that when the signal wiring layers and the insulating layers, formed by a thick film technique using an inorganic insulating paste, are alternately formed on the substrate, the resistance values of via-hole wirings for the power supply, which penetrate the insulating layers, are undesirably larger because of the large thickness of each of the insulating layers.

An object of the present invention is, therefore, to provide a substrate free from the above-mentioned disadvantages of the prior art substrate.

SUMMARY OF THE INVENTION

According to an aspect of the present invention, there is provided a substrate which comprises:

a first power supply wiring layer group having a plurality of first power supply wiring layers for supplying plural different voltages, respectively, and a plurality of first insulating layers for insulating the wiring layers from each other;

a second power supply wiring layer group having a plurality of second power wiring layers, each being in one-to-one correspondence to said plurality of first power supply wiring layers, and a plurality of second insulating layers for insulating the second power supply wiring layers from each other;

a plurality of first via-hole wirings for connecting each of said first power supply wiring layers and a corresponding one of said second power supply wiring layers;

a plurality of terminals provided on the lower surface of said second power supply wiring layer group;

a plurality of second via-hole wirings for connecting said terminals to said plurality of power supply wiring layers;

a signal wiring layer section having a plurality of thin film signal wiring layers, a plurality of third insulating layers for insulating the signal wiring layers from each other, and a plurality of third via-hole wirings for connecting said signal wiring layers to each other and provided on said first power supply wiring layer group; and a plurality of internal wirings whose upper ends are exposed on the top surface of said signal wiring layer section and whose lower ends are connected to said plurality of first power supply wiring layers.

BRIEF DESCRIPTION OF THE DRAWINGS

The features and advantages of the invention will become apparent from the following description when taken in conjunction with the accompanying drawings in which.

DETAILED DESCRIPTION

Figure 1:
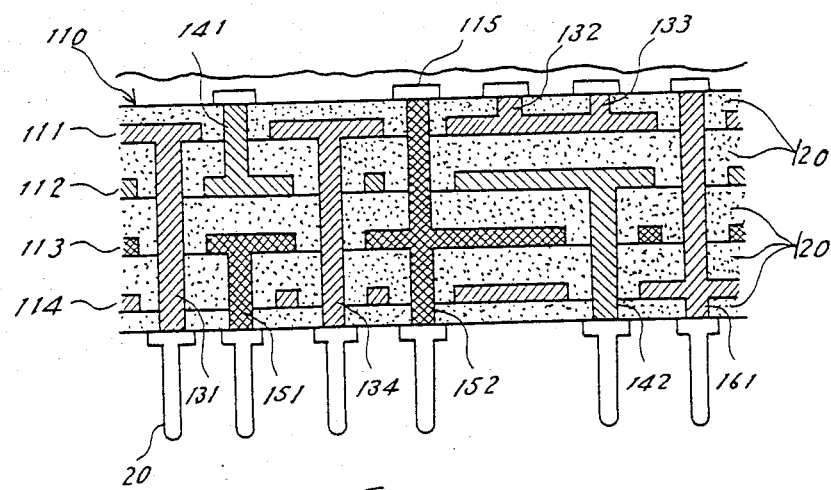
FIG. 1 is a cross-sectional view of a prior art substrate.

Referring to FIG. 1, a prior art ceramic multilayer wiring substrate 110 comprises a first power supply wiring layer 111 connected to via-hole wirings 131 and 134 whose lower ends are exposed on the bottom surface of the substrate 110 and connected to via hole wirings 132 and 133 whose upper ends are exposed on the top surface of the substrate 110; a second power supply wiring layer 112 connected to a via-hole wiring 141 whose upper end is exposed on the top surface of the substrate 110 and connected to a via-hole wiring 142 whose lower end is exposed on the bottom surface of the substrate 110; and a third power supply wiring layer 113 connected to a via-hole wiring 151 whose lower end is exposed on the bottom surface of the substrate 110 and connected to a through-hole wiring 152 penetrating through the substrate 110. The prior art substrate further includes a fourth power supply wiring layer 114 connected to a through-hole wiring 161 penetrating through the substrate 110, a plurality of insulating layers 120 for insulating the wiring layers 111 through 114 from one another, and a plurality of signal wiring layers 115. In the prior art substrate, when a power supply wiring layer (for example, the wiring layer 112) is connected to the wiring layer 115 through the via-hole wiring 141 at a location on the top surface of the substrate, another power supply wiring layer (for example, the wiring layer 111), arranged on a plane which is closer to the top surface of the substrate 110 than the wiring layer 112, cannot be connected to the through-hole wiring 151 located opposite to the via-hole wiring 141. As a result, it is not easy to obtain a predetermined voltage from a desired power supply wiring layer at a desired location on the top surface of the substrate 110.

Figure 2:
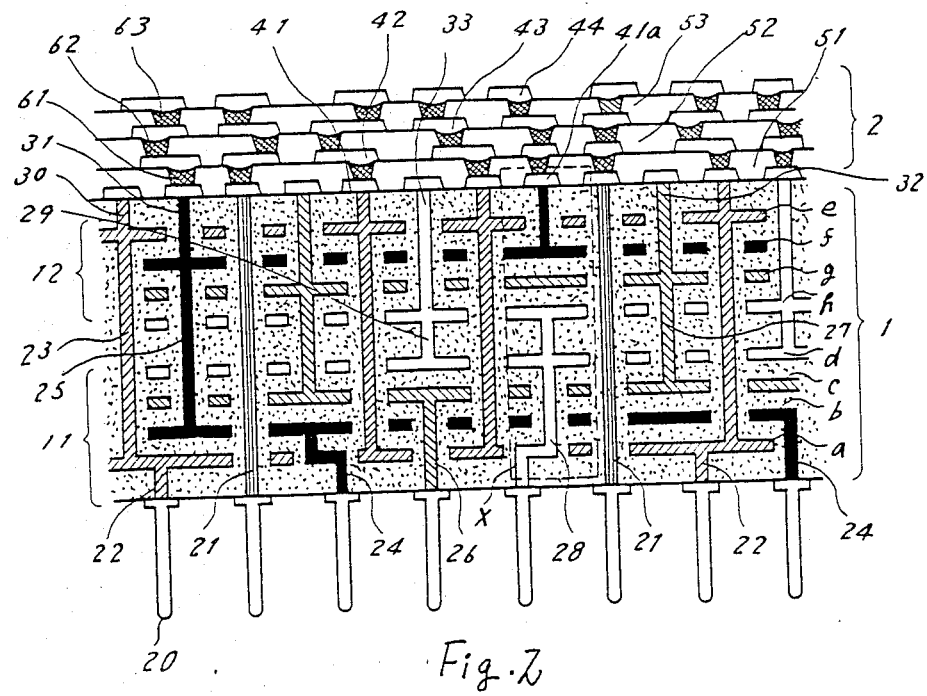
FIG. 2 is a cross-sectional view of a preferred embodiment of the present invention.

Referring to FIG. 2, an embodiment of the invention comprises a ceramic multilayer wiring section 1 and a thin film multilayer wiring section 2. The section 1 comprises pin-shaped terminals 20; through-hole wirings 21 connected to some of the terminals 20 to perform the transmission of signals given to or from the section 2; via-hole wirings 22 and 23 connected to first power supply wiring layers a and e supplying a first power supply source voltage; via-hole wirings 24 and 25 connected to second power supply wiring layers b and f for supplying a second power supply source voltage; via-hole wirings 26 and 27 connected to third power supply wiring layers c and g for supplying a third power supply source voltage; and via-hole wirings 28 and 29 connected to fourth power supply wiring layers d and h for supplying a fourth power supply source voltage. A via-hole wiring 30 connected to the wiring layer e, a via-hole wiring 31 connected to the wiring layer f, a via-hole wiring 32 connected to the wiring layer g and a via-hole wiring 33 connected to the wiring layer h are arranged in the vicinity of the top surface of the section 1. Each of the wiring layers in the wiring section 1 is made of tungsten or molybdenum. The wiring layers a through d on the bottom side of the section 1 belong to a first group 11, while the wiring layers e through h on the top side of the section 1 belong to a second group 12.

Such a structure allows arbitrary connection of any of the terminals 20 to any of the power supply wiring layers in the first group 11 as well as arbitrary connection of any of via-hole wirings arranged at arbitrary positions on the top surface of the section 1 to any of the power supply wiring layers in the second group 12. For example, in the part surrounded by a dashed line X in FIG. 2, the first group 11 alone cannot directly connect the wiring layer b to a portion 41a of a signal wiring layer 41 due to the presence of a throughhole wiring 28 connected to the wiring layer d. However, the layer b can indirectly be connected to the portion 41a by connecting the wiring layer f in the group 12 to the portion 41a. The locations and the number of via-hole wirings connecting the wiring layers, which provide the same power supply source voltage, can be arbitrarily selected as follows:

100 lines between the wiring layers a and e; 50 lines between b and f; 50 lines between c and g; and 20 lines between d and h. In other words, the number and the location of the via-hole wirings can be selected to satisfy the required current capacity of each power supply wiring.

In the embodiment, the thin-film multilayer wiring section 2 formed on the section 1 comprises: thin film signal wiring layers 41, 42, 43 and 44 made of gold or copper; polyimide insulating layers 51, 52 and 53 made of a polyimide material for insulating the signal wiring layers from each other; and via-fills 61, 62 and 63 composed of a mixture of gold and polyimide.

Since a polyimide insulating film has a superior insulation property as compared to the insulating film formed by printing and sintering inorganic paste, sufficient insulation can be achieved by the use of a thin polyimide insulating film. For example, a fifteen-micron thick polyimide insulating film can achieve the same insulation ability as an inorganic insulating film of a sixty-micron thickness. As a result, the resistance of the via-hole wiring penetrating such a thinner polyimide insulating film can be reduced.

While this invention has been described in conjunction with the preferred embodiment thereof, it will now readily be possible for those skilled in the art to put this invention into practice in various other manners.

What is claimed is:

1. A multilayer wiring substrate comprising:
   a first power supply wiring layer group having a plurality of first power supply wiring layers for supplying a plurality of different voltages, respectively, and a plurality of first insulating layers for insulating the wiring layers from each other;
   a second power supply wiring layer groups having a plurality of second power supply wiring layers, each being in one-to-one correspondence to said plurality of first power supply wiring layers, and a plurality of second insulating layers for insulating the second power supply wiring layers from each other;
   a plurality of first via-hole wirings for connecting each of said first power supply wiring layers and a corresponding one of said second power supply wiring layers;
   a plurality of terminals provided on the bottom surface of said second power supply wiring layer group;
   a plurality of second via-hole wirings for connecting said terminals to said plurality of power supply wiring layers;
   a signal wiring layer section having a plurality of thin film signal wiring layers, a plurality of third insulating layers for insulating the signal wiring layers from each other, and a plurality of third via-hole wirings for connecting said signal wiring layers to each other and provided on said first power supply wiring layer group; and
   a plurality of internal wirings whose one ends are exposed on the top surface of said signal wiring layer section and whose the other ends are connected to said plurality of first power supply wiring layers.

2. A multilayer wiring substrate as claimed in claim 1, in which the number of said first via-hole wirings connecting one of said first power supply wiring layers to a corresponding one of said second power supply wiring layers is determined depending on a direct current resistance value required for the corresponding power supply wiring layer.

3. A multilayer wiring substrate as claimed in claim 1, in which each of said third insulating layers is made of polyimide.

4. The multilayer wiring substrate as claimed in claim 3, in which each of said third via hole wirings is made of a material including a mixture of gold and polyimide.

5. A multilayer wiring substrate, comprising:
   a plurality of insulating layers;
   a plurality of power supply wiring layers for supplying power voltages and being interlayered within said insulating layers to form a sandwich having first and second surfaces, said wiring layers being arranged in a first group and a second group, wherein wiring layers in said second group respectively supply voltages corresponding to voltages supplied by wiring layers in said first group;
   a plurality of via-hole wirings disposed within said insulating layers and extending to at least one of the first and second surfaces, each wiring layer of the first group being connected to a wiring layer of the second group that supplies a corresponding voltage by said via-hole wirings; and
   a plurality of terminals connected to each via-hole wiring that extends to one of the first and second surfaces.

6. A multilayer wiring substrate as claimed in claim 5, and further including:
   a signal wiring layer section disposed in contact with said first surface, said section having a plurality of thin film signal wiring layers;
   a plurality of second insulating layers interlayered with said signal wiring layers; and
   a plurality of second via-hole wirings for connecting said signal wiring layers to each other, for connecting signal wiring layers to said terminals on said first surface and for connecting signal wiring layers to terminals on a surface of said section opposite said first surface.

7. A multilayer wiring substrate, as claimed in claim 6, wherein each of said second insulating layers is composed of polyimide.

8. A multilayer wiring substrate, as claimed in claim 7, wherein each of said second via-hole wirings comprises a mixture of gold and polyimide.

9. A method of increasing the accessibility of a desired power supply terminal of a multilayer wiring substrate, comprising the steps of:

provrding a plurality of power supply wiring layers of a first group, each wiring layer of the first group supplying a different voltage;

interlayering said wiring layers of said first group with layers of insulating material;

providing a plurality of power supply wiring layers of a second group, each wiring layer of the second group supplying a voltage corresponding to the voltage supplied by a wiring layer of said first group;

interlayering said wiring layers of said second group with layers of insulating material; and connecting a via-hole wiring between each wiring layer of the first group and the wiring layer of the second group which supplies the voltage corresponding to the voltage supplied by the wiring layer of the first group.

* * * * *